(12) United States Patent
Gerig

(10) Patent No.: US 8,269,504 B2
(45) Date of Patent: Sep. 18, 2012

(54) SYSTEM FOR LOCATING A PARTIAL BREAK IN A WIRE LOOP ANTENNA

(75) Inventor: Duane A. Gerig, Knoxville, TN (US)

(73) Assignee: Radio Systems Corporation, Knoxville, TN (US)

( * ) Notice: Subject to any disclaimer, the term of this patent is extended or adjusted under 35 U.S.C. 154(b) by 424 days.

(21) Appl. No.: 12/697,539

(22) Filed: Feb. 1, 2010

(65) Prior Publication Data

US 2011/0187380 A1 Aug. 4, 2011

(51) Int. Cl.
*G01R 31/08* (2006.01)
*G01R 31/28* (2006.01)

(52) U.S. Cl. ............... 324/523; 324/529; 340/573.3
(58) Field of Classification Search .............. 324/523, 324/529, 71.1, 76.11; 340/573.3
See application file for complete search history.

(56) References Cited

U.S. PATENT DOCUMENTS

| | | | |
|---|---|---|---|
| 5,070,537 A | 12/1991 | Ohira et al. | |
| 5,243,294 A | 9/1993 | Burnett | |
| 5,352,984 A | 10/1994 | Piesinger | |
| 5,608,328 A | 3/1997 | Sanderson | |
| 5,714,885 A | 2/1998 | Lulham | |
| 6,215,314 B1 | 4/2001 | Frankewich, Jr. | |
| 6,310,646 B1 | 10/2001 | Shi et al. | |
| 6,313,874 B1 | 11/2001 | Bowyer et al. | |
| 6,922,060 B1 | 7/2005 | Wendel et al. | |
| 7,030,623 B1 | 4/2006 | Carpenter | |
| 7,075,309 B2 | 7/2006 | Smith | |
| 7,075,310 B2 | 7/2006 | Mason, Jr. et al. | |
| 2007/0229289 A1* | 10/2007 | Gerig et al. | 340/573.3 |

* cited by examiner

*Primary Examiner* — Vincent Q Nguyen
(74) *Attorney, Agent, or Firm* — Pitts & Lake, P.C.

(57) ABSTRACT

Described is a system for locating a partial break in a wire loop antenna. More specifically, the system generates two test signals, each test signal having a signal pattern distinguishable from the other. The system transmits the test signals by way of the antenna such that each test signal radiates from the antenna. The system receives the radiating test signals and generates a signal indicator for each test signal, each signal indicator reflecting properties of its respective test signal. Each signal indicator is analyzed with respect to the other to determine the location of the partial break. Because the test signals have distinguishable signal patterns, the analysis of the signal indicators is simplified and, in certain circumstances, made possible.

22 Claims, 4 Drawing Sheets

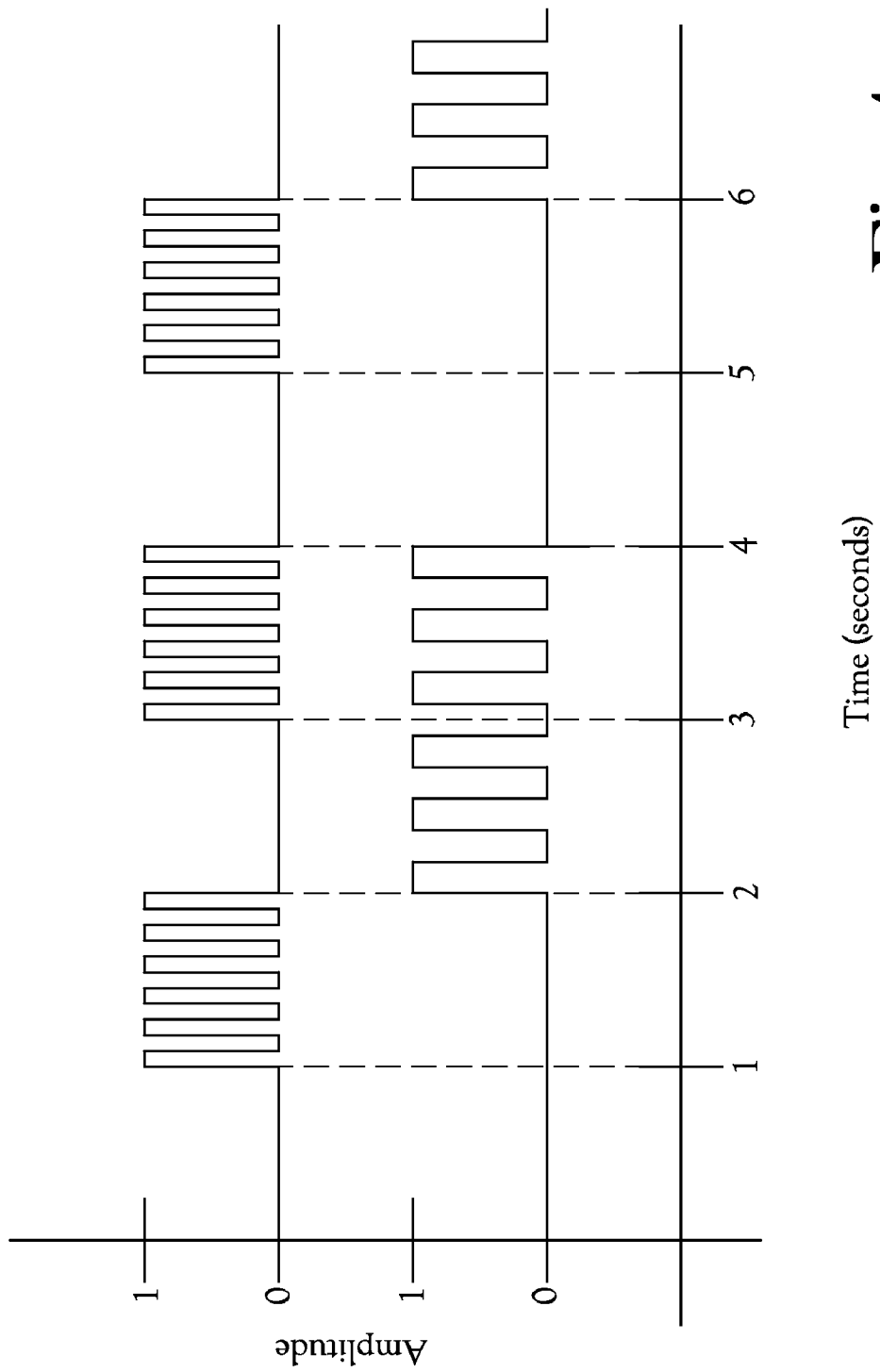

SYSTEM FOR LOCATING A PARTIAL BREAK IN A WIRE LOOP ANTENNA

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

1. Field of the Invention

This invention pertains to a system for locating a partial break or damage in a wire loop antenna such as those used in animal containment systems.

2. Description of the Related Art

Conventional animal containment systems, represented by the one illustrated at FIG. 1, include a transmitter 02, a wire loop antenna 04, and a receiver 06. Each end of the antenna 04 is in electrical communication with the transmitter 02, and the receiver 06 is carried by an animal. The transmitter 02 drives an activation signal through the antenna 04 such that the signal radiates therefrom. The receiver 06 is responsive to the activation signal such that when the animal approaches the antenna 04, the receiver 06 detects the activation signal and, in response such detection, delivers a stimulus to the animal. Typically, the wire loop antenna 04 is buried approximately two to three inches underground to maintain the antenna 04 at its desired position, to protect the antenna 04 from damage, and to hide the typically aesthetically unpleasing antenna from sight. Despite being buried, the antenna 04 is still susceptible to damage, including breaks and partial breaks. When damage does occur, the antenna 04 does not properly radiate the activation signal, and, as a result, the animal containment system does not function as designed. Accordingly, when the antenna 04 becomes damaged, the damaged section must be located, and the antenna 04 must be repaired. However, because the antenna 04 is buried underground, the location of the damaged section is not conspicuous.

Prior art includes conventional wire break location systems for locating a break in a wire loop antenna. Typically, these conventional systems include a signal transmitter and a locator. One such system is disclosed in U.S. Pat. No. 6,215,314. When there is a break in the antenna, the antenna defines two independent sections, each being electrically connected to the transmitter of the animal containment system. Each section of the broken antenna is disconnected from the transmitter of the animal containment system and is connected to the signal transmitter of the break location system. The signal transmitter transmits a first continuous wave signal at a first frequency through one section of the antenna and transmits a second continuous wave signal at a second frequency through the other section. The first frequency is different from the second frequency such that the first continuous wave signal is distinguishable from the second continuous wave signal.

The locator receives the continuous wave signals such that when the first continuous wave signal is received, the locator generates a first continuous audible tone, and when the second continuous wave signal is received, the locator generates a second continuous audible tone. Each audible tone reflects the frequency at which its corresponding continuous wave signal is transmitted such that each audible tone is distinguishable by way of its pitch. As the first and second continuous wave signals are being transmitted through the respective sections of the antenna, the locator is carried in proximity to and along the antenna, starting at one end thereof. For example, initially, the locator is carried along the section of the antenna through which the first continuous wave signal is transmitted. While being carried along this section, the locator generates the first continuous audible tone, indicating its reception of the first continuous wave signal. After the locator traverses the break in the antenna, it is no longer proximate the section of the antenna through which the first continuous wave signal is transmitted but is proximate the section of the antenna through which the second continuous wave signal is transmitted. Consequently, as the locator traverses the break, it shifts from generating the first continuous audible tone to generating the second continuous audible tone. Accordingly, the user determines that the break in the antenna is proximate the location of the locator when the locator shifts from generating the first continuous audible tone to generating the second continuous audible tone.

Conventional wire break location systems are limited in that they are largely ineffective in detecting and locating partial breaks or other damage less than a complete break in a wire loop antenna. More specifically, when the damage to the antenna is not a complete break, the locator does not detect an abrupt change in the transmitted signal at the location of the damage because the first continuous wave signal and the second continuous wave signal are radiated not just from their respective sections of the antenna, but from the entire antenna. Because the attenuation of each of the signals is more gradual, the portion of the antenna where the locator detects both the first continuous wave signal and the second continuous wave signal is extensive. Additionally, because the distinguishing feature of the continuous wave signals is the transmission frequency and because the respective audible tones merely reflect the transmission frequencies, the user is unable to determine the transition from the first continuous audible tone to the second continuous audible tone and, thus, unable to determine the location of the damage to the antenna within a reasonable spatial range. Consequently, a device that indicates the location of a partial break or other damage less than a complete break in a wire loop antenna is desired.

BRIEF SUMMARY OF THE INVENTION

In accordance with the various features of the present invention there is provided a system for locating a partial break or damage less than a complete break in a wire loop antenna. More specifically, the wire loop antenna includes a first end and a second end and defines a first section and a second section. The first section of the antenna is the portion of the antenna between the first end and the partial break, and the second section of the antenna is the portion of the antenna between the second end and the partial break. The system includes a test signal transmitter device and a receiver device. The test signal transmitter device releasably receives the first end and the second end of the antenna such that the test signal transmitter device is in electrical communication with the antenna. The test signal transmitter device generates a first test signal and a second test signal, whereby the signal pattern of the first test signal is distinguishable from that of the second test signal. The test signal transmitter device transmits the first test signal into the first end of the antenna and transmits the second test signal into the second end of the antenna. Accordingly, the most prominent test signal radiating from the first section of the antenna is the first test signal, and the most prominent test signal radiating from the second section of the antenna is the second test signal, the most prominent test signal being the test signal having the strongest signal strength. The receiver device is adapted to receive each of the first test signal and the second test signal. In response to receiving the first test signal, the receiver device generates a first signal indicator, which reflects the signal strength of the first test signal at the receiver device and reflects the signal pattern of the first test signal. Similarly, in response to receiving the second test signal, the receiver device generates a second signal indicator, which reflects the signal strength of the second test signal at the receiver device and reflects the signal pattern of the second test signal.

The receiver device is carried along the first section of the antenna, typically starting at the first end, toward the second section. Accordingly, initially, the first signal indicator is the most prominent of the signal indicators. More specifically, because the first test signal is the most prominent test signal in the first section of the antenna, the first signal indicator, which reflects the first test signal, is the most prominent signal indicator when the receiver device is carried along the first section. When the receiver device traverses the partial break, that is, is carried from the first section of the antenna to the second section, the most prominent signal indicator shifts from being the first signal indicator to the being the second signal indicator. When this occurs, it is determined that the partial break is proximate the receiver device.

Because the partial break in the antenna is less than a complete break, the shift in the prominent signal indicator is subtle. However, because the test signal transmitter device generates the test signals to have distinguishable signal patterns, the subtle shift is detectable such that the system is capable of locating the partial break.

BRIEF DESCRIPTION OF THE SEVERAL VIEWS OF THE DRAWINGS

The above-mentioned features of the invention will become more clearly understood from the following detailed description of the invention read together with the drawings in which:

FIG. 4 illustrates another embodiment of the first test signal and the second test signal.

DETAILED DESCRIPTION OF THE INVENTION

The present invention provides a system for locating a partial break in a wire loop antenna. More specifically, the system generates two test signals, each test signal having a signal pattern distinguishable from the other. The system transmits the test signals by way of the antenna such that each test signal radiates from the antenna. The system receives the radiating test signals and generates a signal indicator for each test signal, each signal indicator reflecting properties of its respective test signal. Each signal indicator is analyzed with respect to the other to determine the location of the partial break, as is detailed in the subsequent discussion. Because the test signals have distinguishable signal patterns, the analysis of the signal indicators is simplified and, in certain circumstances, made possible. One embodiment of the system constructed in accordance with the various features of the present invention is illustrated generally at 10 in FIG. 2.

Figure 1:
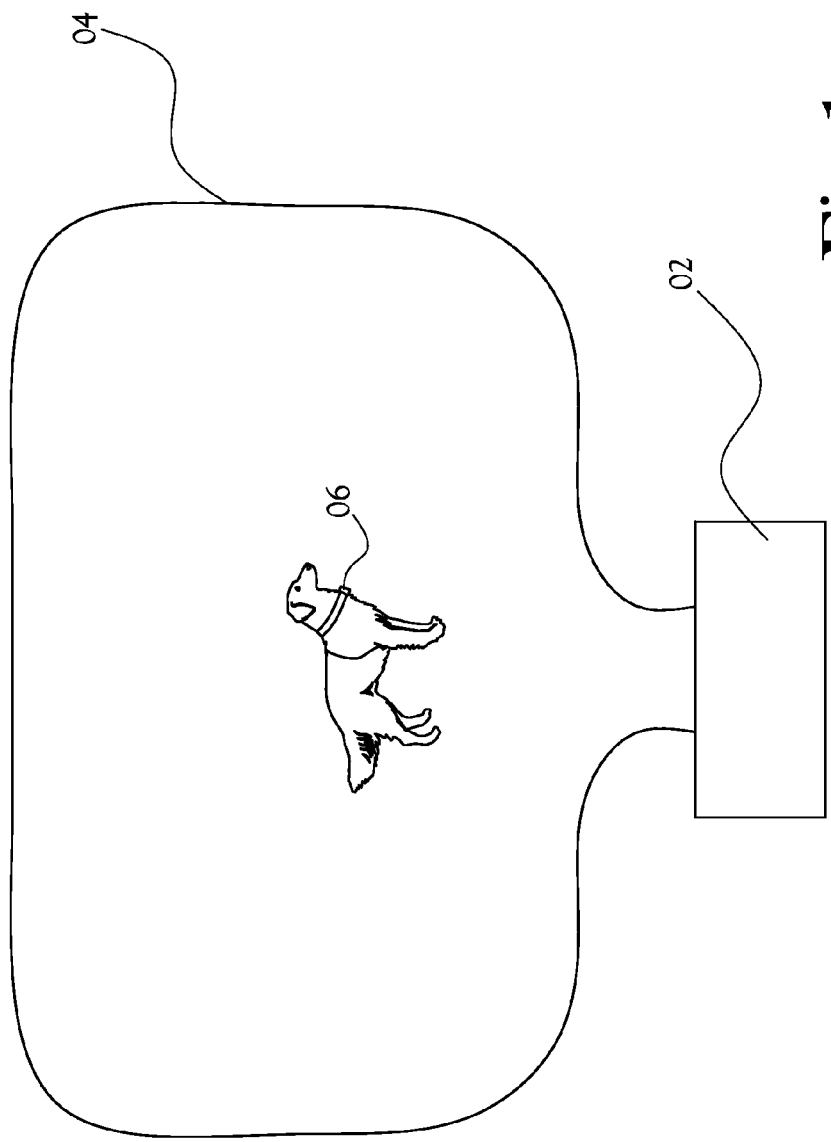
FIG. 1 illustrates a conventional animal containment system that is part of the prior art.

The system 10 includes a test signal transmitter device 12 and a receiver device 14. The test signal transmitter device 12 includes a first antenna connection 16, a second antenna connection 18, and a test signal generator 20, the test signal generator 20 being in electrical communication with the first antenna connection 16 and the second antenna connection 18. The test signal transmitter device 12 receives a wire loop antenna 22 such that the transmitter device 12 is in electrical communication with the antenna 22. More specifically, the wire loop antenna 22 includes a first end 36 and a second end 38. The first antenna connection 16 of the test signal transmitter device 12 receives the first end 36 of the antenna 22, and the second antenna connection 18 of the transmitter device 12 receives the second end 38 of the antenna 22, thereby establishing electrical communication between the test signal transmitter device 12 and the wire loop antenna 22. For example, when the wire loop antenna 22 is a component of an animal containment system, such as that illustrated at FIG. 1, the antenna 22 is disconnected from the transmitter of the animal containment system and connected to, or received by, the test signal transmitter device 12 as discussed above and illustrated at FIG. 2.

Figure 2:
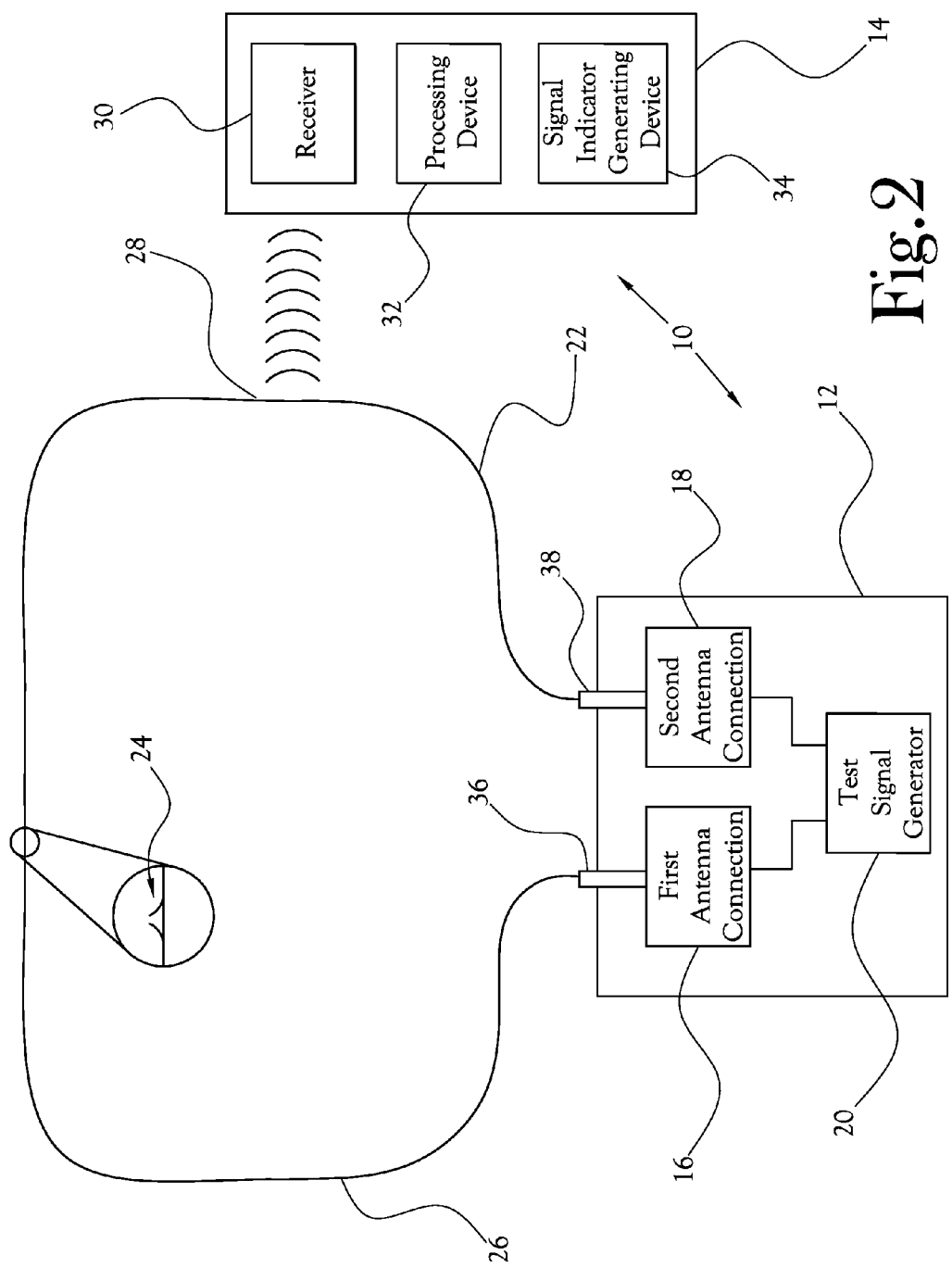
FIG. 2 illustrates one embodiment of the system for locating a partial break in a wire loop antenna in accordance with the various features of the present invention.

Because the system 10 locates a partial break in the antenna 22, in the illustrated embodiment of FIG. 2, the antenna 22 includes a partial break 24. The partial break 24 includes any damage to the antenna 22 that is less than a complete break in the antenna 22. The partial break 24 includes damage to any component of the wire loop antenna 22 that would affect the transmission of a signal, such as damage to the insulation of the wire of the antenna 22. The partial break 24 defines a first section 26 and a second section 28 of the antenna 22. More specifically, the first section 26 of the antenna 22 is the portion of the antenna 22 between the partial break 24 and the first end 36. Similarly, the second section 28 of the antenna 22 is the portion of the antenna 22 between the partial break 24 and the second end 38.

Figure 3:
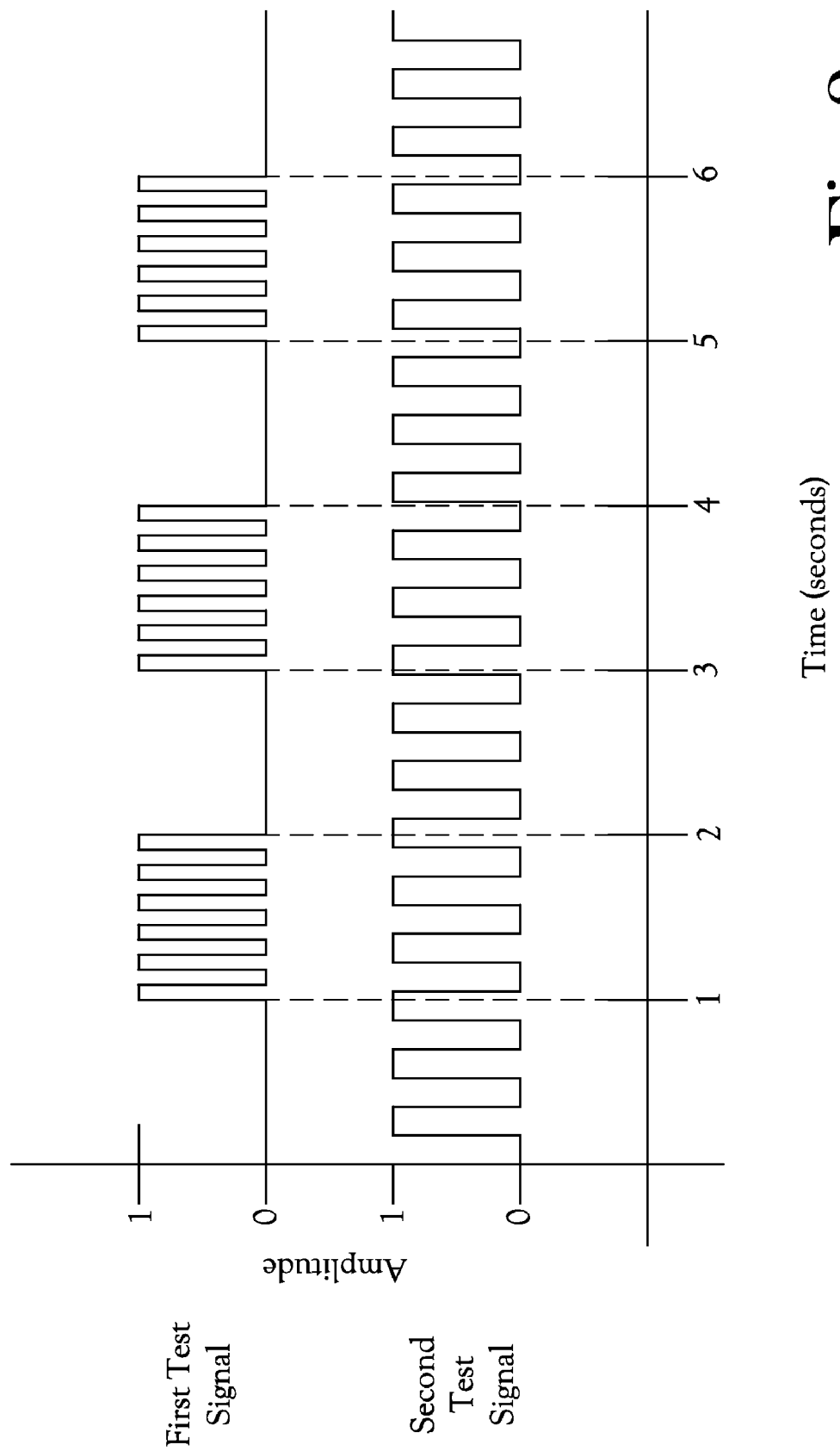
FIG. 3 illustrates one embodiment of the first test signal and the second test signal.

The test signal generator 20 of the test signal transmitter device 12 generates a first test signal and a second test signal, whereby each test signal is generated to have a distinguishable signal pattern. More specifically, in one embodiment, the test signal generator 20 generates one test signal to have an alternating "on/off" signal pattern and generates the other test signal to be a continuously "on" signal. For example, FIG. 3 illustrates the first test signal as having an alternating "on/off" signal pattern with a period of two seconds and the second test signal as being a continuously "on" signal. In another embodiment, the test signal generator 20 generates each test signal to have an alternating "on/off" signal pattern, whereby each test signal is modulated at a distinguishable modulation rate. For example, FIG. 4 illustrates the first test signal and the second test signal as having alternating "on/off" signal patterns, whereby the first test signal is modulated at a modulation rate that is twice that of the second test signal. Although specific examples of distinguishable signal patterns are discussed above, it should be noted that the test signals can be generated to have distinguishable signal patterns by ways other than those discussed above, such as by utilizing distinguishable duty cycles, without departing from the scope or spirit of the present invention. It should also be noted that the first test signal and the second test signal can be transmitted at the same or different frequencies without departing from the scope or spirit of the present invention.

The test signal generator 20 drives the first test signal into the first end 36 of the antenna 22 by way of the first antenna connection 16 and drives the second test signal into the second end 38 of the antenna 22 by way of the second antenna connection 18. Accordingly, the first test signal is the most prominent test signal radiating from the first section 26 of the antenna 22, and the second test signal is the most prominent test signal radiating from the second section 28 of the antenna 22. Stated differently, the signal strength of the first test signal at the first section 26 is greater than that of the second test signal, and the signal strength of the second test signal at the second section 28 is greater than that of the first test signal. More specifically, because the first test signal is driven into the first end 36, the first test signal attenuates as it progresses through the antenna 22 towards the second end 38 and attenuates sharply when it traverses the partial break 24. Similarly, because the second test signal is driven into the second end 38, the second test signal attenuates as it progresses through the antenna 22 towards the first end 36 and attenuates sharply when it traverses the partial break 24. Although the first test signal is the most prominent test signal at the first section 26 and the second test signal is the most prominent test signal at the second section 28, because the partial break 24 is not a complete break in the antenna 22, the first test signal is present at the second section 28, and the second test signal is present at the first section 26. Accordingly, at least a portion of the antenna 22 radiates both the first test signal and the second test signal.

The receiver device 14 includes a receiver 30, a processing device 32, and a signal indicator generating device 34, the receiver 30 being in electrical communication with the processing device 32, which is in electrical communication with the signal indicator generating device 34. The receiver 30 is capable of receiving both the first test signal and the second test signal and forwards the received test signal(s) to the processing device 32. The processing device 32, among other things, conditions the received test signal(s), including amplifying, filtering, and demodulating the signal(s). The signal indicator generating device 34 receives the conditioned test signal(s) and generates a first signal indicator and a second signal indicator, each of the signal indicators being perceivable by the user. More specifically, when the receiver 30 receives the first test signal, the signal indicator generating device 34 generates a first signal indicator. The first signal indicator is representative of the first test signal as it is received by the receiver device 14. More specifically, the intensity of the first signal indicator is proportional to the signal strength of the first test signal as it is received by the receiver device 12, and the first signal indicator reflects the signal pattern of the first test signal. Similarly, when the receiver 30 receives the second test signal, the signal indicator generating device 34 generates a second signal indicator. The second signal indicator is representative of the second test signal as it is received by the receiver device 14. More specifically, the intensity of the second signal indicator is proportional to the signal strength of the second test signal as it is received by the receiver device 12, and the second signal indicator reflects the signal pattern of the second test signal. When the receiver 30 receives both the first test signal and the second test signal simultaneously, the signal indicator generating device 34 generates the first signal indicator and the second signal indicator simultaneously. Accordingly, when the receiver device 14 is proximate the first section 26 of the antenna 22, the most prominent signal indicator is the first signal indicator. Likewise, when the receiver device 14 is proximate the second section 28 of the antenna 22, the most prominent signal indicator is the second signal indicator.

In one embodiment, the first signal indicator and the second signal indicator are audible signals. The intensity of each signal indicator is indicated by the volume of the audible signal such that the volume of the audible signal indicates the signal strength of the corresponding test signal at the receiver device 14. Additionally, the pattern of the audible signal parallels that of the corresponding test signal. For example, when the test signal has an alternating "on/off" signal pattern, whereby the test signal is "on" for one second and "off" for one second, the audible signal sounds for one second and is silent for one second. However, it should be noted that the signal indicators can be indicators other than the above described audible signals without departing from the scope or spirit of the present invention.

To locate the partial break 24 in the antenna 22, the receiver device 14 is carried proximate to and along the antenna 22 such that the first test signal and the second test signal are received by the receiver device 14. The receiver device 14 indicates the location of the partial break 24 when the prominent signal indicator shifts from one signal indicator to the other. For example, to detect the partial break 24, the receiver device 14 is initially positioned proximate the first end 36 of the antenna 22 and is carried along the antenna 22 toward the second end 38. Initially, the prominent signal indicator is the first signal indicator because the receiver device 14 is carried along the first section 26 of the antenna 22. When the receiver device 14 is carried across the partial break 24, that is, from being carried along the first section 26 to being carried along the second section 28, the prominent test signal at the receiver device 14 shifts from being the first test signal to being the second test signal. Accordingly, when the receiver device 14 traverses the partial break 24, the prominent signal indicator shifts from being the first signal indicator to being the second signal indicator. However, because the partial break 24 is less than a complete break in the antenna 22, the shift in the prominent signal indicator from one signal indicator to another is not as pronounced as it is in a complete break situation. More specifically, because the partial break 24 is less than a complete break, the first test signal is present in the second section 28 and the second test signal is present in the first section 26. Consequently, when the receiver device 14 traverses the partial break 24, the presence of one test signal does not cease and the presence of the other initiate, such that one signal indicator ceases and the other initiates. Instead, there is a more subtle shift in the prominent test signal such that there is a more subtle shift in the prominent signal indicator. Consequently, distinguishing a shift in the prominent signal indicator is difficult, if not impossible, when the only distinguishing feature of the test signals is the transmission frequency.

Because the test signal generator 20 generates the first test signal to have a signal pattern that is distinguishable from that of the second test signal, the first signal indicator is easily distinguishable from the second signal indicator such that the subtle shift in the prominent signal indicator resulting from the receiver device 14 traversing the partial break 24 is easily detectible. Accordingly, because the prominent signal indicator shifts from one signal indicator to another when the receiver device 14 traverses the partial break 24, the receiver device 14 indicates the location of the partial break 24 when such a shift occurs.

From the foregoing description, those skilled in the art will recognize that a system for locating a partial break in a wire loop antenna offering advantages over the prior art has been provided. More specifically, the system generates two test signals, each test signal having a signal pattern distinguishable from the other. The system transmits the test signals by way of the antenna such that each test signal radiates from the antenna. The system receives the radiating test signals and generates a signal indicator for each test signal, each signal indicator reflecting properties of its respective test signal. Each signal indicator is analyzed with respect to the other to determine the location of the partial break. Because the test signals have distinguishable signal patterns, the analysis of the signal indicators is simplified and, in certain circumstances, made possible.

While the present invention has been illustrated by description of several embodiments and while the illustrative embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and methods, and illustrative examples shown and described. Accordingly, departures may be made from such details without departing from the spirit or scope of applicant's general inventive concept.

Having thus described the aforementioned invention, what is claimed is:

1. A system for locating a partial break in a wire loop antenna, the wire loop antenna having a first end and a second end and defining a first section between the first end and the partial break and defining a second section between the second end and the partial break, said system comprising:
    a test signal transmitter device capable of receiving the first end and the second end of the wire loop antenna such that said test signal transmitter is in electrical communication with the wire loop antenna, said test signal transmitter device generates a first test signal and a second test signal, the first test signal having a signal pattern that is distinguishable from that of the second test signal, said test signal transmitter device transmits the first test signal into the first end of the wire loop antenna and transmits the second test signal into the second end of the wire loop antenna such that the first test signal is the most prominent test signal radiating from the first section of the antenna and the second test signal is the most prominent test signal radiating from the second section of the antenna; and
    a receiver device capable of receiving the first test signal and the second test signal, said receiver device generates a first signal indicator when it receives the first test signal and generates a second signal indicator when it receives the second test signal, the first signal indicator being representative of the first test signal to the extent that it reflects the signal pattern of the first test signal and the signal strength of the first test signal at said receiver device, the second signal indicator being representative of the second test signal to the extent that it reflects the signal pattern of the second test signal and the signal strength of the second test signal at said receiver device, the first signal indicator being a prominent signal indicator when the first test signal has a signal strength at said receiver device that is greater than that of the second test signal, the second signal indicator being the prominent signal indicator when the second test signal has a signal strength at said receiver device that is greater than that of the first test signal, said receiver device indicates the location of the partial break when the prominent signal indicator shifts from being one of the first signal indicator and the second signal indicator to being the other of the first signal indicator and the second signal indicator.

2. The system of claim 1 wherein said signal transmitter device modulates the first test signal and the second test signal such that the modulation governs the signal pattern of each test signal.

3. The system of claim 1 wherein the first test signal has an "on/off" signal pattern and the second test signal has a continuously "on" signal pattern.

4. The system of claim 1 wherein the first test signal has a duty cycle distinguishable from that of the second test signal.

5. The system of claim 1 wherein the first test signal and the second test signal are transmitted at the same frequency.

6. The system of claim 1 wherein the first test signal and the second test signal are transmitted at different frequencies.

7. The system of claim 1 wherein the partial break includes any damage to the wire loop antenna that is less than a complete break in the antenna.

8. The system of claim 7 wherein the wire loop antenna includes wire insulation and the partial break includes damage to the wire insulation.

9. The system of claim 1 wherein each of the first signal indicator and the second signal indicator is an audible tone.

10. A method for locating a partial break in a wire loop antenna, the wire loop antenna having a first end and a second end and defining a first section between the first end and the partial break and defining a second section between the second end and the partial break, said method comprising the steps of:
    generating a first test signal having a first signal pattern;
    generating a second test signal having a second signal pattern, the first signal pattern being distinguishable from the second signal pattern;
    transmitting the first test signal into the first end of the wire loop antenna such that the first test signal is the most prominent test signal radiating from the first section of the antenna;
    transmitting the second test signal into the second end of the wire loop antenna such that the second test signal is the most prominent test signal radiating from the second section of the antenna;
    receiving the first test signal and the second test signal;
    generating a first signal indicator that is representative of the first test signal to the extent that the first signal indicator reflects the signal pattern of the first test signal and the signal strength of the first test signal at the receiver device;
    generating a second signal indicator that is representative of the second test signal to the extent that the second signal indicator reflects the signal pattern of the second test signal and the signal strength of the second test signal at the receiver device;
    defining the first signal indicator as being a prominent signal indicator when the first test signal has a signal strength at said receiver device that is greater than that of the second test signal;
    defining the second signal indicator as being the prominent signal indicator when the second test signal has a signal strength at said receiver device that is greater than that of the first test signal; and
    indicating the location of the partial break when the prominent signal indicator shifts from being one of the first signal indicator and the second signal indicator to being the other of the first signal indicator and the second signal indicator.

11. The method of claim 10 further comprising the step of modulating the first test signal and the second test signal such that the first signal pattern is distinguishable from the second signal pattern.

12. The method of claim 10 wherein said steps of transmitting include transmitting the first test signal and the second test signal at the same frequency.

13. The method of claim 10 wherein said steps of transmitting include transmitting the first test signal and the second test signal at different frequencies.

14. The method of claim 10 wherein the partial break includes any damage to the wire loop antenna that is less than a complete break in the antenna.

15. A system for locating a partial break in a wire loop antenna, the wire loop antenna having a first end and a second end and defining a first section between the first end and the partial break and defining a second section between the second end and the partial break, said system comprising:

a test signal transmitter device capable of receiving the first end and the second end of the wire loop antenna such that said test signal transmitter is in electrical communication with the wire loop antenna, said test signal transmitter device generates a first test signal and a second test signal and modulates the test signals to have distinguishable signal patterns, said test signal transmitter device transmits the first test signal into the first end of the wire loop antenna and transmits the second test signal into the second end of the wire loop antenna such that the first test signal is the most prominent test signal radiating from the first section of the antenna and the second test signal is the most prominent test signal radiating from the second section of the antenna; and a receiver device capable of receiving the first test signal and the second test signal, said receiver device generates a first signal indicator when it receives the first test signal and generates a second signal indicator when it receives the second test signal, the first signal indicator being representative of the first test signal to the extent that it reflects the signal pattern of the first test signal and the signal strength of the first test signal at said receiver device, the second signal indicator being representative of the second test signal to the extent that it reflects the signal pattern of the second test signal and the signal strength of the second test signal at said receiver device, the first signal indicator being a prominent signal indicator when the first test signal has a signal strength at said receiver device that is greater than that of the second test signal, the second signal indicator being the prominent signal indicator when the second test signal has a signal strength at said receiver device that is greater than that of the first test signal, said receiver device indicates the location of the partial break when the prominent signal indicator shifts from being one of the first signal indicator and the second signal indicator to being the other of the first signal indicator and the second signal indicator.

16. The system of claim 15 wherein the first test signal has an "on/off" signal pattern and the second test signal has a continuously "on" signal pattern.

17. The system of claim 15 wherein the first test signal has a duty cycle distinguishable from that of the second test signal.

18. The system of claim 15 wherein the first test signal and the second test signal are transmitted at the same frequency.

19. The system of claim 15 wherein the first test signal and the second test signal are transmitted at different frequencies.

20. The system of claim 15 wherein the partial break includes any damage to the wire loop antenna that is less than a complete break in the antenna.

21. The system of claim 20 wherein the wire loop antenna includes wire insulation and the partial break includes damage to the wire insulation.

22. The system of claim 15 wherein each of the first signal indicator and the second signal indicator is an audible tone.

\* \* \* \* \*